United States Patent
Chung et al.

(10) Patent No.: US 12,549,194 B2
(45) Date of Patent: Feb. 10, 2026

(54) DIGITAL-TO-ANALOG CONVERTER AND OPERATION METHOD THEREOF

(71) Applicant: Industrial Technology Research Institute, Hsinchu (TW)

(72) Inventors: Yung-Hui Chung, Hsinchu (TW); Yun-Heng Tseng, Yunlin County (TW); Bo-Wei Chen, Miaoli County (TW)

(73) Assignee: Industrial Technology Research Institute, Hsinchu (TW)

( * ) Notice: Subject to any disclaimer, the term of this patent is extended or adjusted under 35 U.S.C. 154(b) by 160 days.

(21) Appl. No.: 18/391,683

(22) Filed: Dec. 21, 2023

(65) Prior Publication Data

US 2025/0202496 A1 Jun. 19, 2025

(30) Foreign Application Priority Data

Dec. 13, 2023 (TW) ................ 112148589

(51) Int. Cl.
*H03M 1/70* (2006.01)
*H03M 1/78* (2006.01)
(Continued)

(52) U.S. Cl.
CPC ............ *H03M 1/70* (2013.01); *H03M 1/785* (2013.01); *H03M 1/06* (2013.01); *H03M 1/66* (2013.01); *H03M 1/78* (2013.01)

(58) Field of Classification Search
CPC .......... H03M 1/70; H03M 1/785; H03M 1/06; H03M 1/78; H03M 1/66
See application file for complete search history.

(56) References Cited

U.S. PATENT DOCUMENTS 4,967,197 A 10/1990 Peng
4,982,192 A 1/1991 Murooka
(Continued)

FOREIGN PATENT DOCUMENTS

TW 201041318 11/2010
TW 201044794 12/2010
TW I439057 5/2014

OTHER PUBLICATIONS

Roddy C. Mclachlan et al., "A 20b Clockless DAC With Sub-ppm INL, 7.5 nV/VHz Noise and 0.05 ppm/° C. Stability", IEEE Journal of Solid-State Circuits, Dec. 2013, pp. 3028-3037, vol. 48, No. 12.
(Continued)

*Primary Examiner* — Joseph J Lauture
(74) *Attorney, Agent, or Firm* — JCIPRNET

(57) ABSTRACT

A digital-to-analog converter (DAC) and an operation method thereof are provided. The DAC includes a first operational amplifier (OPA), a second OPA, a resistor circuit, first switches, second switches, a first voltage shift circuit and a second voltage shift circuit. The first OPA outputs a first operating voltage. The second OPA outputs a second operating voltage. First terminals of the first switches receive the first operating voltage. First terminals of the second switches receive the second operating voltage. Second terminals of the first switches and the second switches are coupled to the resistor circuit. The first switches and the second switches perform switching operations in response to digital values. The first voltage shift circuit provides a first compensation voltage to the first OPA. The second voltage shift circuit provides a second compensation voltage to the second OPA.

21 Claims, 6 Drawing Sheets

(51) Int. Cl.
    *H03M 1/06*           (2006.01)
    *H03M 1/66*           (2006.01)

(56)                 References Cited

U.S. PATENT DOCUMENTS

| | | |
|---|---|---|
| 7,102,424 B2 | 9/2006 | Vorenkamp |
| 7,116,253 B2 | 10/2006 | Norsworthy et al. |
| 7,884,747 B2 | 2/2011 | McLachlan |
| 8,154,433 B2 | 4/2012 | McLachlan et al. |
| 10,848,172 B2 | 11/2020 | Ramalingam et al. |
| 2012/0050080 A1* | 3/2012 | Mclachlan .......... H03M 1/0612 341/118 |
| 2012/0050084 A1 | 3/2012 | McLachlan |
| 2020/0014397 A1 | 1/2020 | Passamani |

OTHER PUBLICATIONS

"Office Action of Taiwan Counterpart Application", issued on Oct. 28, 2024, p. 1-p. 4.

* cited by examiner

DIGITAL-TO-ANALOG CONVERTER AND OPERATION METHOD THEREOF

CROSS-REFERENCE TO RELATED APPLICATION

This application claims the priority benefit of Taiwan application serial no. 112148589, filed on Dec. 13, 2023. The entirety of the above-mentioned patent application is hereby incorporated by reference herein and made a part of this specification.

BACKGROUND

Technical Field

The disclosure generally relates to digital-to-analog converter (DAC) and an operation method for the DAC, and more particularly to a DAC and an operation method capable of adjusting conversion linearity.

Description of Related Art

Generally, a digital-to-analog converter (DAC) can convert a digital value into an analog value (such as a voltage value or current value). However, based on the process differences of the internal components of the DAC, a conversion linearity of the DAC would be variated. In addition, an output range of the DAC would be limited by the reference voltage. Therefore, how to provide a DAC that can adjust the output range and the conversion linearity is one of the research focuses of those skilled in the art.

SUMMARY

The disclosure provides a digital-to-analog converter (DAC) and an operation method capable of adjusting conversion linearity.

The DAC of the disclosure includes a first operational amplifier (OPA), a second OPA, a resistor circuit, first switches, second switches, a first voltage shift circuit and a second voltage shift circuit. The first OPA receives a first reference voltage through a non-inverting input terminal of the first OPA and outputs a first operating voltage according to the first reference voltage. The second OPA receives a second reference voltage through a non-inverting input terminal of the second OPA and outputs a second operating voltage according to the second reference voltage. The resistance circuit includes input resistors. Input terminals of the input resistors are coupled to an output terminal of the DAC. First terminals of the first switches receive the first operating voltage. Second terminals of the first switches are correspondingly coupled to second terminals of the input resistors. First terminals of the second switches receive the second operating voltage. Second terminals of the second switches are correspondingly coupled to the second terminals of the input resistors. The first switches and the second switches perform a switching operation in response to a digital value. The first voltage shift circuit is coupled between an inverting input terminal of the first OPA and the resistance circuit. The first voltage shift circuit provides a first compensation voltage to the inverting input terminal of the first OPA. The second voltage shift circuit is coupled between an inverting input terminal of the second OPA and the resistance circuit. The second voltage shift circuit provides a second compensation voltage to the inverting input terminal of the second OPA. The first compensation voltage is calibrated to adjust an output range of the DAC. The first voltage shift circuit adjusts a conversion linearity of the DAC.

The operation method of the disclosure is used for the DAC. The DAC includes a first operational amplifier (OPA), a second OPA, a resistor circuit, first switches and second switches. The first OPA receives a first reference voltage through a non-inverting input terminal of the first OPA and outputs a first operating voltage according to the first reference voltage. The second OPA receives a second reference voltage through a non-inverting input terminal of the second OPA and outputs a second operating voltage according to the second reference voltage. The resistor circuit includes input resistors. Input terminals of the input resistors are coupled to an output terminal of the DAC. First terminals of the first switches receives the first operating voltage. First terminals of the second switches receives the second operating voltage. Second terminals of the first switches and second terminals of the second switches are correspondingly coupled to second terminals of the input resistors. The operation method includes: performing, by the first switches and the second switches, a switching operation in response to a digital value; providing a first voltage shift circuit, and providing a first compensation voltage to the inverting input terminal of the first OPA by the first voltage shift circuit; providing a second voltage shift circuit, and providing a second compensation voltage to the inverting input terminal of the second OPA by the second voltage shift circuit; and calibrating the first compensation voltage to adjust an output range of the DAC.

Based on the above, the first voltage shift circuit provides a first compensation voltage to the inverting input terminal of the first OPA. The first voltage shift circuit can be calibrated. In this way, the output range and the conversion linearity of the DAC can be adjusted accordingly.

DESCRIPTION OF THE EMBODIMENTS

Figure 1:
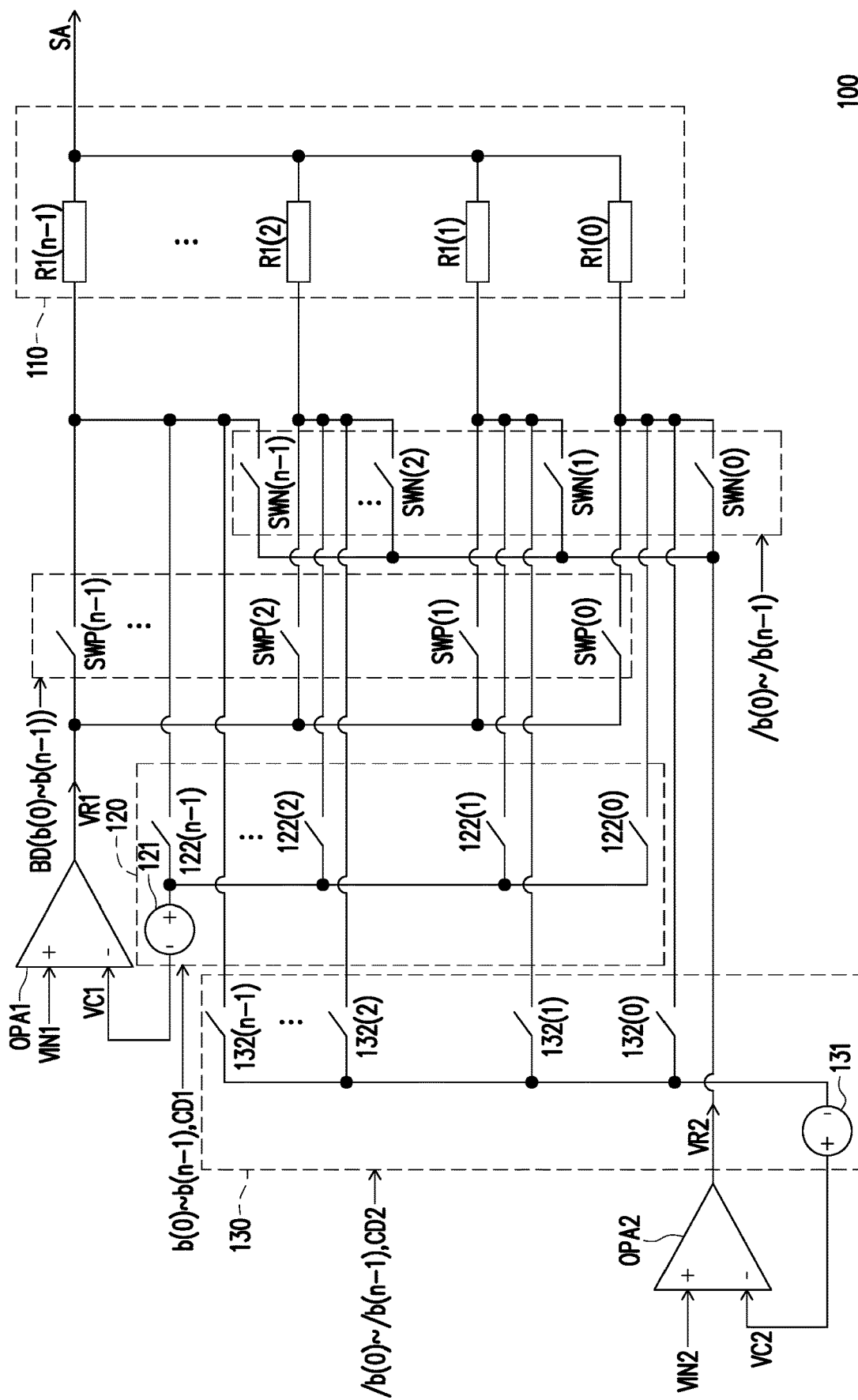
FIG. 1 illustrates a schematic diagram of digital-to-analog converter (DAC) according to a first embodiment of the disclosure.

Some embodiments of the disclosure accompanied with the drawings will now be described in detail. In the reference numerals recited in description below, the same reference numerals shown in different drawings will be regarded as the same or similar elements. These embodiments are only a part of the disclosure and do not disclose all possible implementations of the disclosure. To be more precise, these embodiments are only examples of the appended claims of the disclosure.

Please refer to FIG. 1, FIG. 1 illustrates a schematic diagram of digital-to-analog converter (DAC) according to a first embodiment of the disclosure. In the embodiment, the DAC 100 includes a first operational amplifier OPA1, a second operational amplifier OPA2, a resistance circuit 110, first switches SWP(0) to SWP(n−1), and second switches SWN(0) to SWN(n−1), a first voltage shift circuit 120 and a second voltage shift circuit 130. The first operational amplifier OPA1 receives a reference voltage VIN1 through a non-inverting input terminal of the first operational amplifier OPA1, and outputs an operating voltage VR1 according to the reference voltage VIN1. The second operational amplifier OPA2 receives the reference voltage VIN2 through a non-inverting input terminal of the second operational amplifier OPA2, and outputs an operating voltage VR2 according to the reference voltage VIN2.

In the embodiment, the resistance circuit 110 includes input resistors R1(0) to R1(*n*−1). First terminal of the input resistors R1(0) to R1(*n*−1) is coupled to the output terminal of the DAC 100. First terminals of the first switches SWP(0) to SWP(n−1) receive the operating voltage VR1. Second terminals of the first switches SWP(0) to SWP(n−1) are coupled correspondingly to second terminals of the input resistors R1(0) to R1(*n*−1). First terminals of the second switches SWN(0) to SWN(n−1) receive operating voltage VR2. Second terminals of the second switches SWN(0) to SWN(n−1) are coupled correspondingly to the second terminals of the input resistors R1(0) to R1(*n*−1). The first switches SWP(0) to SWP(n−1) and the second switches SWN(0) to SWN(n−1) perform a switching operation in response to a digital value BD. Therefore, the DAC 100 can convert the digital value BD into an analog signal SA. The analog signal SA can be a voltage signal or a current signal. A voltage value or a current value of the analog signal SA is proportional to the digital value BD.

For example, the second terminal of the first switch SWP(0) and the second terminal of the second switch SWP(0) are coupled to the second terminal of the input resistor R1(0). The second terminal of the first switch SWP(1) and the second terminal of the second switch SWP(1) are coupled to the second terminal of the input resistor R1(1), and so on. The first switch SWP(0) can perform a switching operation according to the bit value b(0) of the digital value BD. The second switch SWN(0) can perform a switching operation according to the complementary value /b(0) of the bit value b(0) of the digital value BD. The first switch SWP(0) can perform a switching operation according to the bit value b(1) of the digital value BD. The second switch SWN(0) can perform switching operations according to the complementary value /b(1) of the bit value b(1) of the digital value BD, and so on. In one embodiment, the bit value b(0) may be the value of the least significant bit (LSB) of the digital value BD. The bit value b(n−1) may be the value of the most significant bit (MSB) of the digital value BD. In another embodiment, the bit value b(0) may be the value of the calibration reference bit of the digital value BD. The bit value b(1) may be the value of the LSB of the digital value BD.

For example, a resistance value of the input resistor R1(1) is twice a resistance value of the input resistor R1(0). A resistance value of the input resistor R1(2) is twice the resistance value of the input resistor R1(1), and so on.

In the embodiment, the first voltage shift circuit 120 is coupled between the inverting input terminal of the first operational amplifier OPA1 and the resistance circuit 110. The first voltage shift circuit 120 provides a compensation voltage VC1 to the inverting input terminal of the first operational amplifier OPA1. The second voltage shift circuit 130 is coupled between the inverting input terminal of the second operational amplifier OPA2 and the resistance circuit 110. The second voltage shift circuit 130 provides a compensation voltage VC2 to the inverting input terminal of the second operational amplifier OPA2.

It should be noted, the compensation voltage VC1 can be calibrated or adjusted. Therefore, the operating voltage VR1 provided by the first operational amplifier OPA1 can be adjusted accordingly. The ease of use of the first operational amplifier OPA1 can be improved. An output range of the DAC 100 is no longer limited to (VIN1−VIN2). The output range of the DAC 100 can be increased as the compensation voltage VC1, VC2 changes and be not limited to by (VIN1−VIN2). For example, the output range of DAC 100 is equal to ((VIN1+VC1)−(VIN2−VC2)). That is, the output range of DAC 100 is equal to ((VIN1−VIN2)+(VC1+VC2)). In this way, the output range of the DAC 100 can be adjusted or improved. The converting flexibility of the DAC 100 can be improved.

Furthermore, the first voltage shift circuit 120 receives an input voltage from the second terminal of the input resistors R1(0) to R1(*n*−1). The first voltage shift circuit 120 shifts the input voltage to generate compensation voltage VC1. A shifting voltage value between compensation voltage VC1 and the input voltage can be determined by a calibrating signal CD2. Therefore, the first operational amplifier OPA1 can adjust the operating voltage VR1 according to a change of the compensation voltage VC1.

In this embodiment, the compensation voltage VC2 can also be calibrated or adjusted. The second voltage shift circuit 130 receives the input voltage of the second terminal from the input resistors R1(0) to R1(*n*−1). The second voltage shift circuit 130 shifts the input voltage to generate compensation voltage VC2. The shifting voltage value between compensation voltage VC2 and input voltage can also be determined by a calibrating signal CD1. The second operational amplifier OPA2 can adjust the operating voltage VR2 according to changes in the compensation voltage VC2.

In the embodiment, the first voltage shift circuit 120 includes a voltage shifter 121 and control switches 122(0) to 122(*n*−1). An output terminal of the voltage shifter 121 is coupled to the inverting input terminal of the first operational amplifier OPA1. First terminals of the control switches 122(0) to 122(*n*−1) are coupled to an input terminal of the voltage shifter 121. Second terminals of the control switches 122(0) to 122(*n*−1) are coupled correspondingly to the second terminals of the input resistors R1(0) to R1(*n*−1).

For example, the second terminal of the control switch 122(0) is coupled to the second terminal of the input resistor R1(0). The second terminal of control switch 122(1) is coupled to the second terminal of input resistor R1(1), and so on.

The control switch 122(0) performs the switching operation according to the bit value b(0) of the digital value BD. The control switch 122(1) performs the switching operation according to the bit value b(1) of the digital value BD, and so on. Therefore, the control switch 122(0) and the first switch SWP(0) are simultaneously turned on or turned off according to the bit value b(0) of the digital value BD. When the control switch 122(1) and the first switch SWP(1) are simultaneously turned on or turned off according to the bit value b(1) of the digital value BD, and so on.

By this way, when the control switch 122(0) and the first switch SWP(O) are turned on, the voltage shifter 121 and the first operational amplifier OPA1 form a closed-loop. The input equivalent impedance value of the second terminal of the input resistor R1(0) can be significantly reduced. Furthermore, the first operational amplifier OPA1 can provide gain (for example, $10^6$). Therefore, when the control switch 122(0) and the first switch SWP(0) are turned on, the input equivalent impedance value drops by $10^6$ times.

When at least one of the control switches 122(0) to 122($n-1$) is turned on, the voltage shifter 121 shifts the input voltage on the input terminal of the voltage shifter 121 to generate the compensation voltage VC1, and outputs compensation voltage VC1 through the output terminal of the voltage shifter 121. In the embodiment, a voltage value of compensation voltage VC1 is lower than a voltage value of input voltage. Therefore, the voltage shifter 121 may be implemented by a DC buck circuit.

In the embodiment, the second voltage shift circuit 130 includes a voltage shifter 131 and control switches 132(0) to 132($n-1$). An output terminal of the voltage shifter 131 is coupled to the inverting input terminal of the second operational amplifier OPA2. First terminals of the control switches 132(0) to 132($n-1$) are coupled to the input terminal of the voltage shifter 131. Second terminals of the control switches 132(0) to 132($n-1$) are coupled correspondingly to the second terminals of the input resistors R1(0) to R1($n-1$).

For example, the second terminal of the control switch 132(0) is coupled to the second terminal of the input resistor R1(0). The second terminal of control switch 132(1) is coupled to the second terminal of input resistor R1(1), and so on.

The control switch 132(0) performs the switching operation according to the complementary value /b(0) of the bit value b(0) of the digital value BD. The control switch 132(1) performs the switching operation according to the complementary value /b(1) of the bit value b(1) of the digital value BD, and so on. Therefore, the control switch 132(0) and the second switch SWN(0) are simultaneously turned on or turned off according to the complementary value /b(0) of the bit value b(0) of the digital value BD. When the control switch 132(1) and the second switch SWN(1) are simultaneously turned on or turned off according to the complementary value /b(1) of the bit value b(1) of the digital value BD, and so on.

When at least one of the control switches 132(0) to 132($n-1$) is turned on, the voltage shifter 131 shifts the input voltage on the input terminal of the voltage shifter 131 to generate the compensation voltage VC2, and outputs the compensation voltage VC2 through the output terminal of the voltage shifter 131. In this embodiment, a voltage value of compensation voltage VC2 is higher than the voltage value of input voltage. Therefore, the voltage shifter 131 may be implemented by a DC boost circuit.

By this way, the voltage value of the compensation voltage VC1 is lower than the voltage value of the input voltage received by the voltage shifter 121. The voltage value of the compensation voltage VC2 is higher than the voltage value of the input voltage received by the voltage shifter 131. Based on the voltage shift of the voltage shifters 121 and 131, the compensation voltages VC1 and VC2 may have the same voltage value. The reference voltages VIN1 and VIN2 may have the same voltage value. In this way, the reference voltages VIN1 and VIN2 can be implemented using the same voltage source.

Figure 2:
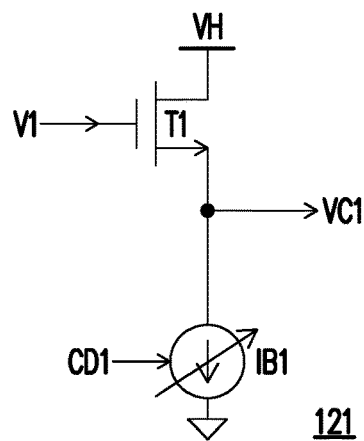
FIG. 2 illustrates a schematic diagram of a voltage shifter of a first voltage shift circuit according to an embodiment of the disclosure.

Please refer to FIG. 1 and FIG. 2, FIG. 2 illustrates a schematic diagram of a voltage shifter of a first voltage shift circuit according to an embodiment of the disclosure. In the embodiment, the voltage shifter 121 includes a transistor T1 and a current source IB1. A first terminal of the transistor T1 is coupled to a reference high voltage VH. A control terminal of the transistor T1 is coupled to the input terminal of the voltage shifter 121 to receive the input voltage V1. A second terminal of the transistor T1 is coupled to the output terminal of the voltage shifter 121. The current source IB1 is coupled to the second terminal of the transistor T1. In the embodiment, the current source IB1 adjusts a shifting voltage value of the voltage shifter 121 according to the calibrating signal CD1.

Furthermore, the voltage value of compensation voltage VC1 can be determined according to formula (1) and formula (2).

$$VC1 = V1 - (Vth + Vov) \qquad \text{formula (1)}$$

$$Vov = VGS - Vth \qquad \text{formula (2)}$$

"Vov" is an overdrive voltage of transistor T1. "Vth" is a threshold voltage of transistor T1. "VGS" is a voltage difference between the control terminal of transistor T1 and the second terminal of transistor T1. It can be seen that the voltage value of compensation voltage VC1 can be determined by the voltage difference between input voltage V1 and voltage difference VGS from formula (1) and formula (2). In other words, the shifting voltage value is equal to the voltage difference VGS between the control terminal of the transistor T1 and the second terminal of the transistor T1. The current value of current source IB1 can change the voltage value of the second terminal of transistor T1 according to the calibrating signal CD1, thereby changing the voltage value of the second terminal of transistor T1.

In the embodiment, the transistor T1 may be implemented by an N-type field effect transistor (FET), but the disclosure is not limited thereto.

Figure 3:
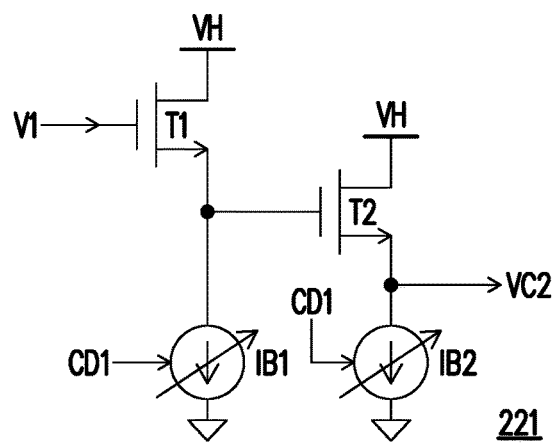
FIG. 3 illustrates a schematic diagram of a voltage shifter of a first voltage shift circuit according to another embodiment of the disclosure.

Please refer to FIG. 1 and FIG. 3, FIG. 3 illustrates a schematic diagram of a voltage shifter of a first voltage shift circuit according to another embodiment of the disclosure. In the embodiment, the voltage shifter 221 includes transistors T1 and T2 and current sources IB1 and IB2. A first terminal of the transistor T1 is coupled to the reference high voltage VH. A control terminal of the transistor T1 is coupled to an input terminal of the voltage shifter 221 to receive the input voltage V1. The current source IB1 is coupled to a second terminal of the transistor T1. A first terminal of the transistor T2 is coupled to the reference high voltage VH. A control terminal of the transistor T2 is coupled to the second terminal of the transistor T1. A second terminal of the transistor T2 is coupled to an output terminal of the voltage shifter 221. The current source IB2 is coupled to the second terminal of the transistor T2. The current sources IB1 and IB2 adjust a shifting voltage value of the voltage shifter 221 according to the calibrating signal CD1.

Furthermore, the voltage value of compensation voltage VC1 can be determined according to formula (3).

$$VC1 = V1 - 2(Vth + Vov) \qquad \text{formula (3)}$$

In other words, the shifting voltage value is equal to twice the voltage difference VGS between the control terminal of the transistor T1 and the second terminal of the transistor T1.

In the embodiment, the transistors T1 and T2 may be implemented by an N-type FET, but the disclosure is not limited thereto.

Figure 4:
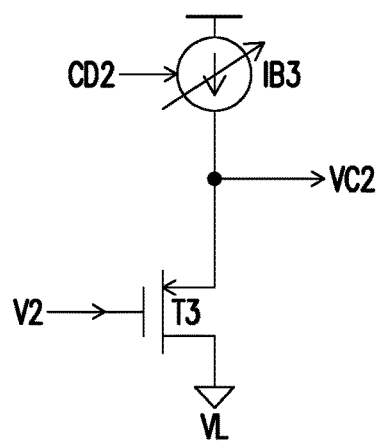
FIG. 4 illustrates a schematic diagram of a voltage shifter of a second voltage shift circuit according to an embodiment of the disclosure.

Please refer to FIG. 1 and FIG. 4, FIG. 4 illustrates a schematic diagram of a voltage shifter of a second voltage shift circuit according to an embodiment of the disclosure. In the embodiment, the voltage shifter 131 includes a current source IB3 and a transistor T3. A first terminal of the transistor T3 is coupled to the current source IB and the output terminal of the voltage shifter 131. A control terminal of the transistor T3 is coupled to the input terminal of the voltage shifter 131 to receive the input voltage V2. A second terminal of the transistor T3 is coupled to a reference low voltage VL (for example, ground). The current source IB3 adjusts the shifting voltage value of the voltage shifter 131 according to the calibrating signal CD2. The voltage shifting value is, for example, equal to the voltage difference between the first terminal of the transistor T1 and the control terminal of the transistor T1.

In the embodiment, the transistor T3 may be implemented by a P-type FET, but the disclosure is not limited thereto.

Figure 5:
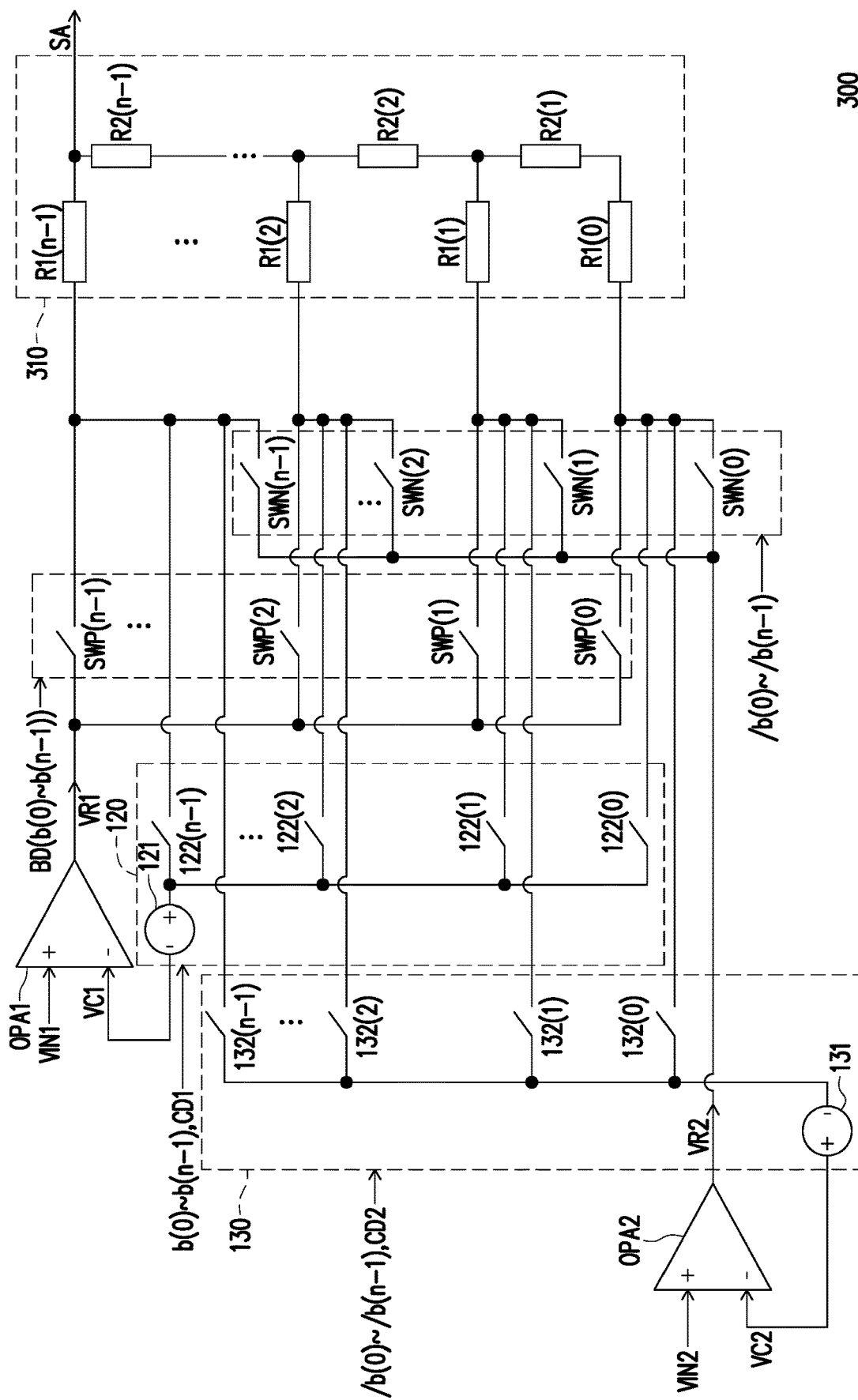
FIG. 5 illustrates a schematic diagram of digital-to-analog converter (DAC) according to a second embodiment of the disclosure.

Please refer to FIG. 5, FIG. 5 illustrates a schematic diagram of digital-to-analog converter (DAC) according to a second embodiment of the disclosure. In the embodiment, the DAC 300 includes the first operational amplifier OPA1, the second operational amplifier OPA2, a resistance circuit 310, the first switches SWP(0) to SWP(n−1), the second switches SWN(0) to SWN(n−1), the first voltage shift circuit 120 and the second voltage shift circuit 130. In the embodiment, the implementation of the first operational amplifier OPA1, the second operational amplifier OPA2, the first switches SWP(0) to SWP(n−1), the second switches SWN(0) to SWN(n−1), the first voltage shift the circuit 120 and the second voltage shift circuit 130 has been clearly explained in the embodiments of FIGS. 1 to 4, so it will not be repeated here.

In the embodiment, the resistance circuit 310 is an R2R ladder resistor network. The resistance circuit 310 includes the input resistors R1(0) to R1(n−1) and bridge resistors R2(2) to R2(n−1). The bridge resistor R2(2) is coupled between the first terminal of the input resistor R1(1) and the first terminal of the input resistor R1(2). Bridge resistor R2(3) is coupled between a first terminal of input resistor R1(2) and a first terminal of input resistor R1(3) (not shown), and so on. In the embodiment, the resistance values of the input resistors R1(0) to R1(n−1) are the same as each other. Resistance values of the bridge resistors R2(2) to R2(n−1) are the same as each other. In addition, the resistance value of the input resistors R1(0) to R1(n−1) is twice the resistance value of the bridge resistors R2(1) to R2(n−1).

Figure 6:
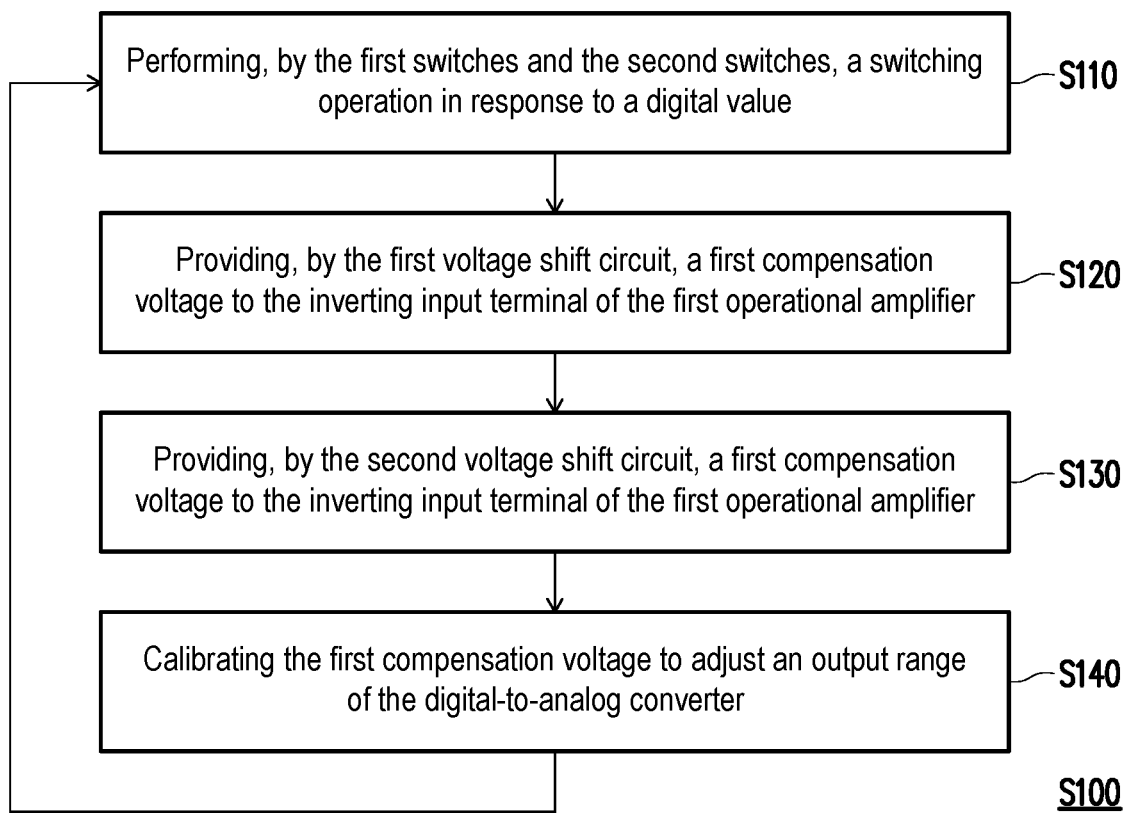
FIG. 6 illustrates a flow diagram of an operation method according to an embodiment of the disclosure.

Please refer to FIG. 1 and FIG. 6, FIG. 6 illustrates a flow diagram of an operation method according to an embodiment of the disclosure. In the embodiment, the operation method S100 is applicable to the DAC 100. The operation method S100 includes steps S110 to S140. In the step S110, the first switches SWP(0) to SWP(n−1) and the second switches SWN(0) to SWN(n−1) perform the switching operation in response to the digital value BD. In the step S120, the first voltage shift circuit 120 provides compensation voltage VC1 to the inverting input terminal of the first operational amplifier OPA1. In the step S130, the second voltage shift circuit 130 provides compensation voltage VC2 to the inverting input terminal of the second operational amplifier OPA2. In the step S140, the compensation voltage VC1 is calibrated to adjust the output range of the DAC 100, and returns to step S110. The implementation of the steps S110 to S140 has been clearly explained in the embodiments of FIGS. 1 to 4, so it will not be repeated here.

A sequence of steps S110 to S140 can be changed. The operation method S100 of the disclosure is not limited to the sequence of this embodiment.

It should be understood that operating method S100 is also used to the DAC 300.

Figure 7:
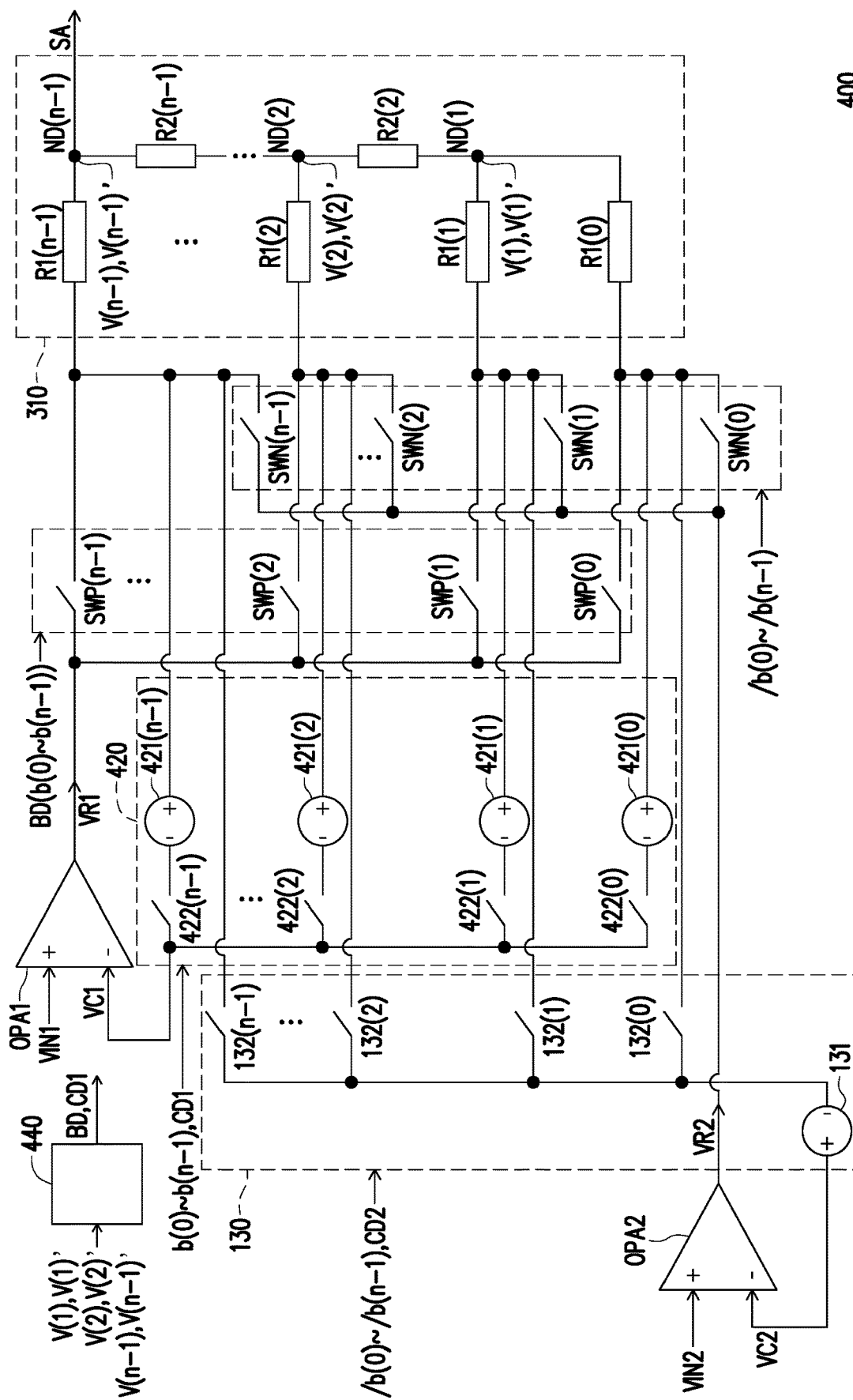
FIG. 7 illustrates a schematic diagram of digital-to-analog converter (DAC) according to a third embodiment of the disclosure.

Please refer to FIG. 7, FIG. 7 illustrates a schematic diagram of digital-to-analog converter (DAC) according to a third embodiment of the disclosure. In the embodiment, the DAC 400 includes the first operational amplifier OPA1, the second operational amplifier OPA2, the resistance circuit 310, the first switches SWP(0) to SWP(n−1), and the second switches SWN(0) to SWN(n−1), a first voltage shift circuit 420, a second voltage shift circuit 130 and a control circuit 440. In the embodiment, the implementation of the first operational amplifier OPA1, the second operational amplifier OPA2, the resistance circuit 310, the first switches SWP(0) to SWP(n−1), the second switches SWN(0) to SWN(n−1), and the second voltage shift circuit 130 has been clearly explained in the embodiments of FIG. 1, FIG. 4, and FIG. 5, so it will not be repeated here.

In the embodiment, the first voltage shift circuit 420 includes voltage shifters 421(0) to 421(n−1) and control switches 422(0) to 422(n−1). Input terminals of the voltage shifters 421(0) to 421(n−1) are coupled correspondingly to the second terminals of the input resistors R1(0) to R1(n−1). First terminals of the control switches 422(0) to 422(n−1) are coupled correspondingly to the output terminals of the voltage shifters 421(0) to 421(n−1). Second terminal of the control switches 422(0) to 422(n−1) are coupled to the inverting input terminal of the first operational amplifier OPA1.

For example, the input terminal of the voltage shifter 421(0) (that is, a 0th bit voltage shifter) is coupled to the second terminal of input resistor R1(0). The first terminal of the control switch 422(0) (that is, a 0th bit control switch) is coupled to the output terminal of the voltage shifter 421(0). The voltage shifter 421(0) and the control switch 422(0) may form the 0th bit path of the first voltage shift circuit 420. The input terminal of the voltage shifter 421(1) (that is, a first bit voltage shifter) is coupled to the second terminal of input resistor R1(1). The first terminal of the control switch 422(1) (that is, a first bit control switch) is coupled to the output terminal of the voltage shifter 421(1). The voltage shifter 421(1) and the control switch 422(1) may form the first bit path of the first voltage shift circuit 420. Similarly, the voltage shifter 421(2) (that is, a second bit voltage shifter) and the control switch 422(2) (that is, a second bit control switch) may form the second bit path of the first voltage shift circuit 420. The voltage shifter 421(n−1) (that is, a (n−1)th bit voltage shifter) and the control switch 422(n−1) (that is, a (n−1)th bit control switch) may form the first voltage The (n−1)th bit path of shift circuit 420.

Figure 8:
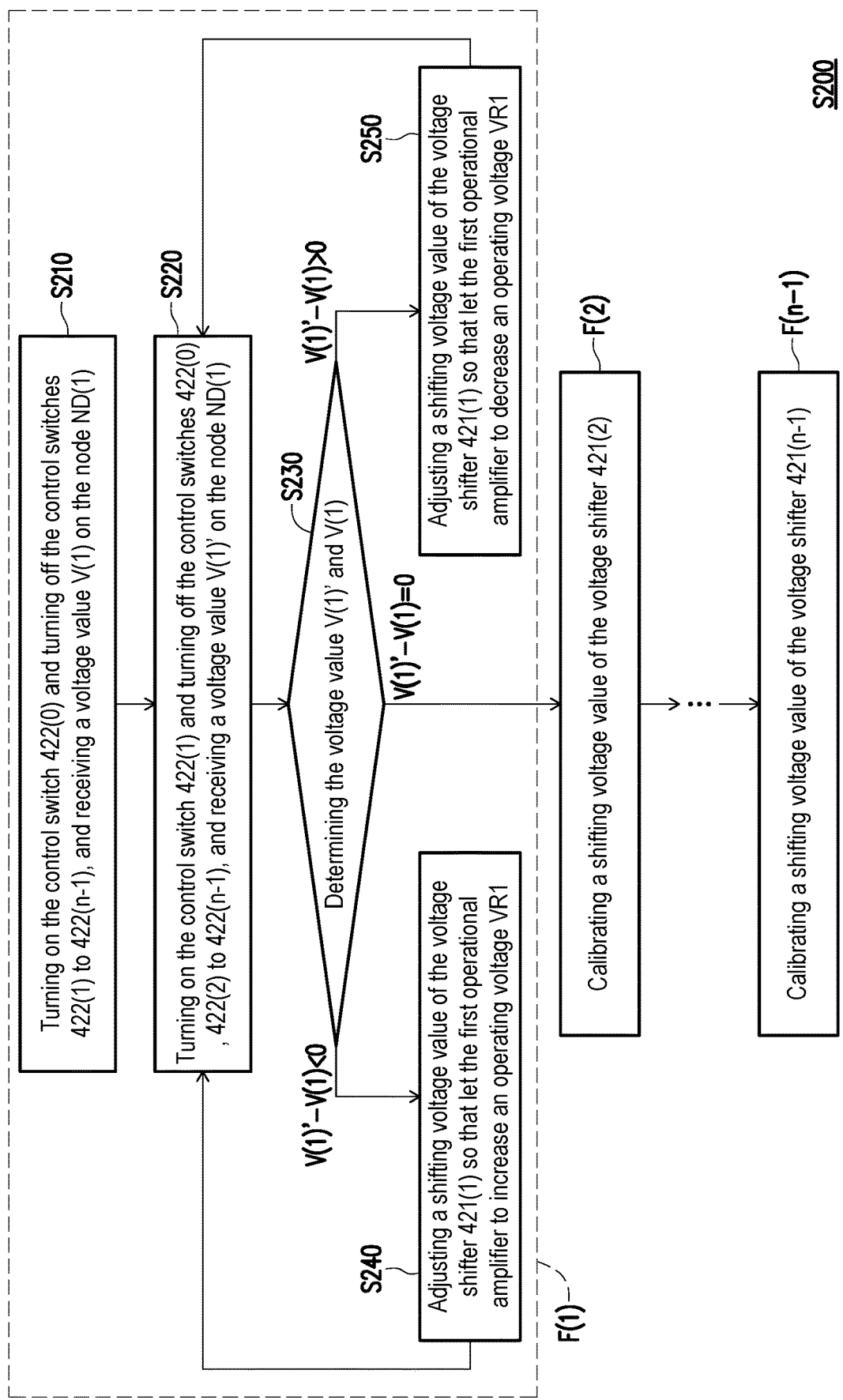
FIG. 8 illustrates a calibrating flow diagram according to an embodiment of the disclosure.

Please refer to FIG. 7 and FIG. 8, FIG. 8 illustrates a calibrating flow diagram according to an embodiment of the disclosure. In the embodiment, a calibrating process S200 can improve the conversion linearity of the DAC 400. The calibrating process S200 includes steps F(1) to F(n−1). In the step F(1), a shifting voltage value of the voltage shifter 421(1) in the first bit path is calibrated. The step F(1) includes steps S210 to S250. In the step S210, the control circuit 440 turns on the control switch 422(0) and turns off the control switches 422(1) to 422(n−1) to receive a voltage value V(1) on a node ND(1). In the step S220, the control circuit 440 turns on the control switch 422(1) and turns off the control switches 422(0), 422(2) to 422(n−1) to receive a voltage value V(1)' at node ND(1).

Next, the control circuit 440 determines whether the voltage value V(1)' conforms to the voltage value V(1). When the voltage value V(1)' does not conform to the voltage value V(1), the control circuit 440 adjusts the shifting voltage value of the voltage shifter 421(1) until the voltage value V(1)' conforms to the voltage value V(1). The "conforms to" means that there is a specific ratio between the voltage value V(1)' and the voltage value V(1) (for example, V(1)':V(1)=1:1 or 2:1). Taking this embodiment as an example, the resistance circuit 310 is an R2R ladder resistance network. Therefore, when the voltage value V(1)' is equal to the voltage value V(1), it means that the voltage value V(1)' coincides with the voltage value V(1).

Taking this embodiment as an example, in the step S230, the control circuit 440 determines a difference between the voltage value V(1)' minus the voltage value V(1). When the difference is lower than 0, it means that the voltage value V(1)' is lower than the voltage value V(1). Therefore, the control circuit 440 uses the calibrating signal CD1 to adjust the shifting voltage value of the voltage shifter 421(1) in the step S240, so that the first operational amplifier OPA1 increases the operating voltage VR1. Therefore, the voltage value V(1)' is increased.

When the difference between the voltage value V(1)' minus the voltage value V(1) is higher than 0, it means that the voltage value V(1)' is higher than the voltage value V(1). Therefore, the control circuit 440 uses the calibrating signal CD1 to adjust the shifting voltage value of the voltage shifter 421(1) in the step S250, so that the first operational amplifier OPA1 decreases the operating voltage VR1. Therefore, the voltage value V(1)' is decreased.

When the difference between the voltage value V(1)' minus the voltage value V(1) is equal to 0, it means that the voltage value V(1)' is equal to the voltage value V(1). The calibration of the shifting voltage value of the voltage shifter 421(1) has been completed. Next, a shifting voltage value of the voltage shifter 421(2) in the second bit path is calibrated in the step F(2).

In the step F(2), the control circuit 440 turns on the control switches 422(0) and 422(1) and turns off the control switches 422(2) to 422(n−1) to receive a voltage value V(2) on a node ND(2). The control circuit 440 turns on the control switch 422(2) and turns off the remaining control switches in the first voltage shift circuit 420 to receive a voltage value V(2)' on the node ND(2). The control circuit 440 determines whether the voltage value V(2)' conforms to the voltage value V(2). When the voltage value V(2)' does not conform to the voltage value V(2), the control circuit 440 adjusts the shifting voltage value of the voltage shifter 421(2) until the voltage value V(2)' conforms to the voltage value V(2).

When the voltage value V(2)' conforms to the voltage value V(2), the calibration of the shifting voltage value of the voltage shifter 421(2) has been completed. Next, a shifting voltage value of the voltage shifter in a third bit path is calibrated in next step.

In the step F(n−1), a shifting voltage value of the voltage shifter 421(n−1) in the (n−1)th bit path is calibrated. The control circuit 440 turns off the control switch 422(n−1) and turns on the remaining control switches in the first voltage shift circuit 420 to receive a voltage value V(n−1) on a node ND(n−1). The control circuit 440 turns on the control switch 422(n−1) and turns off the remaining control switches in the first voltage shift circuit 420 to receive a voltage value V(n−1)' on the node ND(n−1). The control circuit 440 determines whether the voltage value V(n−1)' conforms to the voltage value V(n−1). When the voltage value V(n−1)' does not conform to the voltage value V(n−1), the control circuit 440 adjusts a shifting voltage value of the voltage shifter 421(n−1) until the voltage value V(n−1)' conforms to the voltage value V(n−1).

When the voltage value V(n−1)' conforms to the voltage value V(n−1), the calibration of the shifting voltage value of the voltage shifter 421(n−1) has been completed. Therefore, the conversion linearity of the DAC 400 can be adjusted or improved.

In view of the foregoing, the first voltage shift circuit provides the first compensation voltage to the inverting input terminal of the first operational amplifier. The first compensation voltage can be calibrated. Therefore, the first operating voltage can be adjusted accordingly. In this way, the output range of the DAC can be adjusted or increased. In addition, the conversion flexibility of the DAC can be improved. Furthermore, based on the calibrating process of the first voltage shift circuit, the conversion linearity of the DAC can be adjusted or improved. Therefore, the conversion accuracy of the DAC can be improved.

Although the disclosure has been described with reference to the above embodiments, they are not intended to limit the disclosure. It will be apparent to one of ordinary skill in the art that modifications to the described embodiments may be made without departing from the spirit and the scope of the disclosure. Accordingly, the scope of the disclosure will be defined by the attached claims and their equivalents and not by the above detailed descriptions.

What is claimed is:

1. A digital-to-analog converter, wherein the digital-to-analog converter converts a digital value into an analog signal, wherein the digital-to-analog converter comprises:
    a first operational amplifier, configured to receive a first reference voltage through a non-inverting input terminal of the first operational amplifier and output a first operating voltage according to the first reference voltage;
    a second operational amplifier, configured to receive a second reference voltage through a non-inverting input terminal of the second operational amplifier and output a second operating voltage according to the second reference voltage;
    a resistance circuit, comprising a plurality of input resistors, wherein input terminals of the plurality of input resistors are coupled to an output terminal of the digital-to-analog converter;
    a plurality of first switches, first terminals of the plurality of first switches receive the first operating voltage, second terminals of the plurality of first switches are correspondingly coupled to second terminals of the input resistors;
    a plurality of second switches, first terminals of the plurality of second switches receive the second operating voltage, second terminals of the plurality of second switches are correspondingly coupled to the second terminals of the input resistors, wherein the plurality of first switches and the plurality of second switches perform a switching operation in response to bit values of the digital value;
    a first voltage shift circuit, coupled between an inverting input terminal of the first operational amplifier and the resistance circuit, and configured to provide a first compensation voltage to the inverting input terminal of the first operational amplifier; and a second voltage shift circuit, coupled between an inverting input terminal of the second operational amplifier and the resistance circuit, and configured to provide a second compensation voltage to the inverting input terminal of the second operational amplifier, wherein the first compensation voltage is calibrated to adjust an output range of the digital-to-analog converter, wherein the first voltage shift circuit adjusts a conversion linearity of the digital-to-analog converter.

2. The digital-to-analog converter of claim 1, wherein the voltage shift circuit comprises:
   a first voltage shifter, an output terminal of the first voltage shifter is coupled to the inverting input terminal of the first operational amplifier; and
   a plurality of first control switches, first terminals of the plurality of first control switches are coupled to an input terminal of the first voltage shifter, second terminals of the plurality of first control switches are correspondingly coupled to the second terminals of the input resistors.

3. The digital-to-analog converter of claim 2, wherein the first voltage shifter shifts an input voltage on the input terminal of the first voltage shifter to generate the first compensation voltage, and outputs the first compensation voltage through an output terminal of the first voltage shifter.

4. The digital-to-analog converter of claim 3, wherein a voltage value of the first compensation voltage is lower than a voltage value of the input voltage.

5. The digital-to-analog converter of claim 3, wherein the first voltage shifter comprises:
   a transistor, a first terminal of the transistor is coupled to a reference high voltage, a control terminal of the transistor is coupled to the input terminal of the first voltage shifter to receive the input voltage, a second terminal of the transistor is coupled to the output terminal of the first voltage shifter; and
   a current source, coupled to the second terminal of the transistor,
   wherein the current source adjusts a shifting voltage value of the first voltage shifter according to a calibrating signal.

6. The digital-to-analog converter of claim 3, wherein the first voltage shifter comprises:
   a first transistor, a first terminal of the first transistor is coupled to a reference high voltage, a control terminal of the first transistor is coupled to the input terminal of the first voltage shifter to receive the input voltage;
   a first current source, coupled to the second terminal of the first transistor;
   a second transistor, a first terminal of the second transistor is coupled to a reference high voltage, a control terminal of the second transistor is coupled to the second terminal of the first transistor, a second terminal of the second transistor is coupled to the output terminal of the first voltage shifter; and
   a second current source, coupled to the second terminal of the second transistor,
   wherein the first current source and the second current source adjust a shifting voltage value of the first voltage shifter according to a calibrating signal.

7. The digital-to-analog converter of claim 1, wherein the second voltage shift circuit comprises:
   a second voltage shifter, an output terminal of the second voltage shifter is coupled to the inverting input terminal of the second operational amplifier; and
   a plurality of second control switches, first terminals of the plurality of second control switches are coupled to an input terminal of the second voltage shifter, second terminals of the plurality of second control switches are correspondingly coupled to the second terminals of the input resistors.

8. The digital-to-analog converter of claim 7, wherein the second voltage shifter shifts an input voltage on the input terminal of the second voltage shifter to generate the second compensation voltage, and outputs the second compensation voltage through an output terminal of the second voltage shifter.

9. The digital-to-analog converter of claim 8, wherein a voltage value of the second compensation voltage is higher than a voltage value of the input voltage.

10. The digital-to-analog converter of claim 8, wherein
    a current source; and
    a transistor, a first terminal of the transistor is coupled to the current source and the output terminal of the second voltage shifter, a control terminal of the transistor is coupled to the input terminal of the second voltage shifter to receive the input voltage, a second terminal of the transistor is coupled to a reference low voltage; and
    wherein the current source adjusts a shifting voltage value of the second voltage shifter according to a calibrating signal.

11. The digital-to-analog converter of claim 1, wherein the first voltage shift circuit comprises:
    a plurality of first voltage shifters, input terminals of the plurality of first voltage shifters are correspondingly coupled to the second terminals of the input resistors; and
    a plurality of first control switches, first terminals of the plurality first control switches are correspondingly coupled to the output terminals of the plurality of first voltage shifters, second terminals of the plurality first control switches are coupled to the inverting input terminal of the first operational amplifier.

12. The digital-to-analog converter of claim 11, wherein:
    the digital-to-analog converter further comprises a control circuit,
    the plurality of first voltage shifters comprise a 0th bit voltage shifter to an (n−1)th bit voltage shifter,
    the plurality of first control switches comprise a 0th bit control switch to an (n−1)th bit control switch,
    the control circuit turns on the 0th bit control switch and turns off remaining first control switches, and receives a first voltage value on a first node of the resistance circuit, and
    the control circuit turns on a first bit control switch and turns off remaining first control switches, and receives a second voltage value on the first node of the resistance circuit.

13. The digital-to-analog converter of claim 12, wherein:
    the control circuit determines the whether the second voltage value conforms to the first voltage value, and
    when the second voltage value does not conform to the first voltage value, the control circuit adjusts a shifting voltage value of the first bit voltage shifter until the second voltage value conforms to the first voltage value.

14. The digital-to-analog converter of claim 13, wherein when the second voltage value conforms to the first voltage value:
    the control circuit turns on the 0th bit control switch and the first bit control switch and turns off remaining first control switches, and receives a third voltage value on a second node of the resistance circuit, and the control circuit turns on a second bit control switch and turns off remaining first control switches, and receives a fourth voltage value on the second node of the resistance circuit.

15. The digital-to-analog converter of claim 14, wherein:
the control circuit determines the whether the fourth voltage value conforms to the third voltage value, and
when the fourth voltage value does not conform to the third voltage value, the control circuit adjusts a shifting voltage value of the second bit voltage shifter until the fourth voltage value conforms to the third voltage value.

16. A operation method for a digital-to-analog converter, wherein the digital-to-analog converter converts a digital value into an analog signal, wherein the digital-to-analog converter comprises a first operational amplifier, a second operational amplifier, a resistor circuit, a plurality of first switches and a plurality of second switches, wherein the first operational amplifier receives a first reference voltage through a non-inverting input terminal of the first operational amplifier and outputs a first operating voltage according to the first reference voltage, wherein the second operational amplifier receives a second reference voltage through a non-inverting input terminal of the second operational amplifier and outputs a second operating voltage according to the second reference voltage, wherein the resistor circuit comprises a plurality of input resistors, wherein input terminals of the plurality of input resistors are coupled to an output terminal of the digital-to-analog converter, wherein first terminals of the plurality of first switches receives the first operating voltage, wherein first terminals of the plurality of second switches receives the second operating voltage, wherein second terminals of the plurality of first switches and second terminals of the plurality of second switches are correspondingly coupled to second terminals of the input resistors, wherein the operation method comprises:

performing, by the plurality of first switches and the plurality of second switches, a switching operation in response to bit values of the digital value;

providing a first voltage shift circuit, and providing a first compensation voltage to the inverting input terminal of the first operational amplifier by the first voltage shift circuit;

providing a second voltage shift circuit, and providing a second compensation voltage to the inverting input terminal of the second operational amplifier by the second voltage shift circuit; and calibrating the first compensation voltage to adjust an output range of the digital-to-analog converter.

17. The operation method of claim 16, wherein the first voltage shift circuit comprises:

a plurality of first voltage shifters, input terminals of the plurality of first voltage shifters are correspondingly coupled to the second terminals of the input resistors; and a plurality of first control switches, first terminals of the plurality first control switches are correspondingly coupled to the output terminals of the plurality of first voltage shifters, second terminals of the plurality first control switches are coupled to the inverting input terminal of the first operational amplifier.

18. The operation method of claim 17, wherein the plurality of first voltage shifters comprise a 0th bit voltage shifter to an (n−1)th bit voltage shifter, wherein the plurality of first control switches comprise a 0th bit control switch to an (n−1)th bit control switch, wherein the operation method further comprises:

turning on the 0th bit control switch and turning off remaining first control switches according to a first value of the digital value, and receives a first voltage value on a first node of the resistance circuit, and turning on a first bit control switch and turning off remaining first control switches according to a second value of the digital value, and receives a second voltage value on the first node of the resistance circuit.

19. The operation method of claim 18, further comprising:
determining the whether the second voltage value conforms to the first voltage value; and
when the second voltage value does not conform to the first voltage value, adjusting a shifting voltage value of the first bit voltage shifter until the second voltage value conforms to the first voltage value.

20. The operation method of claim 19, further comprising:
when the second voltage value conforms to the first voltage value, turning on the 0th bit control switch and the first bit control switch and turning off remaining first control switches according to a first value of the digital value, and receives a third voltage value on a second node of the resistance circuit, and
turning on a second bit control switch and turning off remaining first control switches according to a second value of the digital value, and receives a fourth voltage value on the second node of the resistance circuit.

21. The operation method of claim 20, further comprising:
determining the whether the fourth voltage value conforms to the third voltage value, and
when the fourth voltage value does not conform to the third voltage value, adjusting a shifting voltage value of the second bit voltage shifter until the fourth voltage value matches the third voltage value.

* * * * *